United States Patent
Iwamoto (10) Patent No.: US 10,707,825 B2
(45) Date of Patent: Jul. 7, 2020

(54) METHOD FOR MANUFACTURING ELASTIC WAVE DEVICE, AND ELASTIC WAVE DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 411 days.

(21) Appl. No.: 15/622,105

(22) Filed: Jun. 14, 2017

(65) Prior Publication Data

US 2017/0279429 A1    Sep. 28, 2017

Related U.S. Application Data

(63) Continuation of application No. PCT/JP2016/051203, filed on Jan. 18, 2016.

(30) Foreign Application Priority Data

Jan. 22, 2015 (JP) .................. 2015-010213

(51) Int. Cl.
*H03H 9/145* (2006.01)
*H03H 3/08* (2006.01)
(Continued)

(52) U.S. Cl.
CPC .............. *H03H 3/08* (2013.01); *H03H 9/145* (2013.01); *H03H 9/64* (2013.01); *H03H 9/72* (2013.01)

(58) Field of Classification Search
CPC .......... H03H 9/145; H03H 9/645; H03H 9/64; H03H 9/72
See application file for complete search history.

(56) References Cited

U.S. PATENT DOCUMENTS 6,377,138 B1 * 4/2002 Takagi .................... H03H 3/08
310/313 B
7,148,610 B2 * 12/2006 Jacot ....................... H03H 3/08
310/364

(Continued)

FOREIGN PATENT DOCUMENTS

JP     06-252686 A    9/1994
JP     2001-168671 A  6/2001

(Continued)

OTHER PUBLICATIONS

Official Communication issued in International Patent Application No. PCT/JP2016/051203, dated Apr. 5, 2016.

*Primary Examiner* — J. San Martin
(74) *Attorney, Agent, or Firm* — Keating & Bennett, LLP (57) ABSTRACT

A method for manufacturing an elastic wave device includes successively stacking conductive films on a piezoelectric substrate on which a pattern of a first resist has been formed, removing the first resist from the piezoelectric substrate on which the conductive films have been stacked; applying a second resist to the piezoelectric substrate from which the first resist has been removed and subjecting the second resist to exposure and development, thus forming a protective layer that protects a first region with the second resist, and etching the second conductive material in a state in which the first region is protected by the protective layer.

6 Claims, 11 Drawing Sheets

(51) Int. Cl.
*H03H 9/64* (2006.01)
*H03H 9/72* (2006.01)

(56) References Cited

U.S. PATENT DOCUMENTS

| | | | | |
|---|---|---|---|---|
| 8,564,172 | B2 * | 10/2013 | Seki | H03H 9/02842 |
| | | | | 310/313 A |
| 9,331,667 | B2 * | 5/2016 | Steiner | H03H 9/02834 |
| 10,270,421 | B2 * | 4/2019 | Kawasaki | H03H 9/6489 |
| 10,447,235 | B2 * | 10/2019 | Yasuda | H03H 9/6436 |
| 2003/0038562 | A1 * | 2/2003 | Ikada | H03H 3/08 |
| | | | | 310/313 B |
| 2005/0174200 | A1 * | 8/2005 | Lee | H03H 3/08 |
| | | | | 333/193 |
| 2007/0241841 | A1 * | 10/2007 | Hauser | H03H 9/6423 |
| | | | | 333/193 |
| 2012/0194033 | A1 * | 8/2012 | Tsuda | H03H 3/08 |
| | | | | 310/313 C |
| 2017/0201232 | A1 * | 7/2017 | Nakamura | H03H 3/08 |
| 2019/0334500 | A1 * | 10/2019 | Horikawa | H03H 9/25 |
| 2019/0372551 | A1 * | 12/2019 | Daimon | H03H 9/25 |

FOREIGN PATENT DOCUMENTS

| | | |
|---|---|---|
| JP | 2005-223876 A | 8/2005 |
| JP | 2010-081211 A | 4/2010 |
| JP | 2011-009882 A | 1/2011 |

* cited by examiner

METHOD FOR MANUFACTURING ELASTIC WAVE DEVICE, AND ELASTIC WAVE DEVICE

CROSS REFERENCE TO RELATED APPLICATIONS

This application claims the benefit of priority to Japanese Patent Application No. 2015-010213 filed on Jan. 22, 2015 and is a Continuation Application of PCT Application No. PCT/JP2016/051203 filed on Jan. 18, 2016. The entire contents of each application are hereby incorporated herein by reference.

BACKGROUND OF THE INVENTION

1. Field of the Invention

The present invention relates to an elastic wave device including at least two or more IDT electrodes with different resonant frequencies and film thicknesses on the same piezoelectric substrate.

2. Description of the Related Art

In a known method for manufacturing an elastic wave device including at least two or more IDT electrodes with different resonant frequencies and film thicknesses on the same piezoelectric substrate, the IDTs are manufactured in different steps.

However, when the IDTs are manufactured in different steps, the line widths of the IDTs vary in different ways, and it becomes difficult to adjust the frequencies afterwards.

The line widths of the IDTs have been prevented from varying in different ways by, for example, a method for manufacturing an elastic wave filter disclosed in Japanese Unexamined Patent Application Publication No. 2010-81211. According to this method, all metal films included in the IDTs are stacked, an unnecessary electrode layer is removed by etching, and then simultaneous etching is performed.

More specifically, all metal films included in IDT electrodes are formed, and then etching for determining the film thicknesses of the IDTs is performed. After that, a resist pattern is formed by photolithography, and then etching for determining the line widths of the IDTs is performed.

Unfortunately, according to the method for manufacturing an elastic wave filter disclosed in Japanese Unexamined Patent Application Publication No. 2010-81211, exposure and development are performed by photolithography after all metal films included in the IDT electrodes are formed, and then a resist for forming a pattern of the IDT electrodes is formed. Therefore, it is necessary to perform etching for determining the line widths of the IDT electrodes afterwards. Thus, the line widths of the IDT electrodes are determined by two steps: a resist forming step and an etching step. As a result, the line widths of the IDT electrodes greatly vary.

SUMMARY OF THE INVENTION

Accordingly, preferred embodiments of the present invention provide a method for manufacturing an elastic wave device, which includes at least two or more IDT electrodes with different film thicknesses formed on the same piezoelectric substrate and in which variations in line widths of the IDT electrodes are small or negligible, and provide the elastic wave device. This is achieved by forming a resist pattern by photolithography, forming all layers of two or more types of metal films that are included in the IDT electrodes and that include a material resistant to etching, and then etching a layer that is not resistant to etching.

A method for manufacturing an elastic wave filter according to a preferred embodiment of the present invention includes the steps of applying a first resist to the principal surface of a piezoelectric substrate and subjecting the first resist to exposure and development, thus forming a pattern of the first resist, the pattern corresponding to a shape of a first comb-shaped electrode in a first region of the principal surface in which the first comb-shaped electrode is to be formed, and to a shape of a second comb-shaped electrode in a second region of the principal surface in which the second comb-shaped electrode is to be formed; successively stacking a plurality of films made of conductive materials on the piezoelectric substrate on which the pattern of the first resist has been formed; removing the first resist from the piezoelectric substrate on which the plurality of films have been stacked; applying a second resist to the piezoelectric substrate from which the first resist has been removed and subjecting the second resist to exposure and development, thus forming a protective layer that protects the first region with the second resist; and etching the second conductive material in a state in which the first region is protected by the protective layer.

The elastic wave device is, for example, a filter, a duplexer, a triplexer, or a multiplexer.

In this manufacturing method, the line widths of the first and second comb-shaped electrodes are determined and set in a single step of forming the pattern of the first resist without performing an etching step. Accordingly, in a method for manufacturing the elastic wave filter according to a preferred embodiment of the present invention, the line widths of the first and second comb-shaped electrodes are determined by a smaller number of steps compared to the method according to the related art. Therefore, variations in the line widths of the comb-shaped electrodes are reduced.

When the comb-shaped electrodes are formed by the step of successively stacking a plurality of films made of conductive materials after the pattern of the first resist is formed, each comb-shaped electrode is tapered so that a width thereof decreases with increasing distance in a direction away from the piezoelectric substrate. When each comb-shaped electrode is tapered in this manner, an insulating material that covers the comb-shaped electrode is able to be easily applied to a side surface of the comb-shaped electrode. Thus, the insulation reliability of each comb-shaped electrode is able to be increased due to the tapered shape of the comb-shaped electrode.

The development of the second resist may be performed so that the second resist in the second region and the conductive material of an uppermost layer in the second region are dissolved.

In this manufacturing method, the conductive material of the uppermost layer in the second region is etched when the protective layer in the first region is formed. Therefore, in this manufacturing method, the overall process is simplified.

An etchant for dissolving the conductive material of an uppermost layer in the second region may contain a component that passivates the conductive material of a lower layer that is adjacent to the uppermost layer.

When, for example, copper (Cu) is used as the conductive material of the uppermost layer and nickel (Ni) is used as the conductive material of a lower layer that is below the uppermost layer, nitric acid ($HNO_3$), which has an oxidizing function, is used as a component that passivates nickel. In this case, when the copper contained in the uppermost layer is dissolved and the nitric acid comes into contact with the surface of the lower layer that contains nickel, a passivation coating is formed on the surface of the lower layer as a result of oxidization of the nickel. This passivation coating defines and functions as an etching stop layer that prevents the metal film containing nickel from being dissolved during etching. Thus, in this preferred embodiment, the passivation coating prevents the conductive material of the lower layer from being dissolved by the etchant for dissolving the conductive material of the uppermost layer, so that a change in thickness of the lower layer in the second region is able to be reduced.

According to various preferred embodiments of the present invention, variations in widths of the IDT electrodes are reduced in an elastic wave device including at least two or more IDT electrodes formed on the same piezoelectric substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
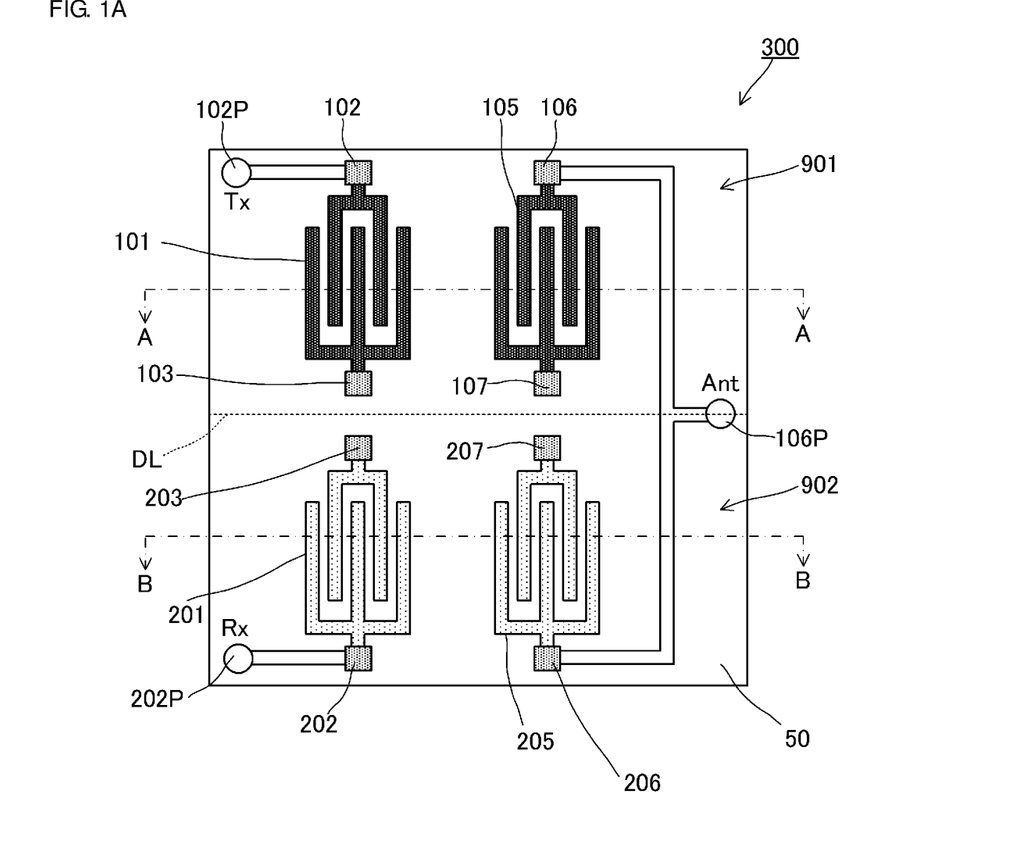
FIG. 1A is a plan view of an elastic wave device according to a preferred embodiment of the present invention.
Figure 1B:
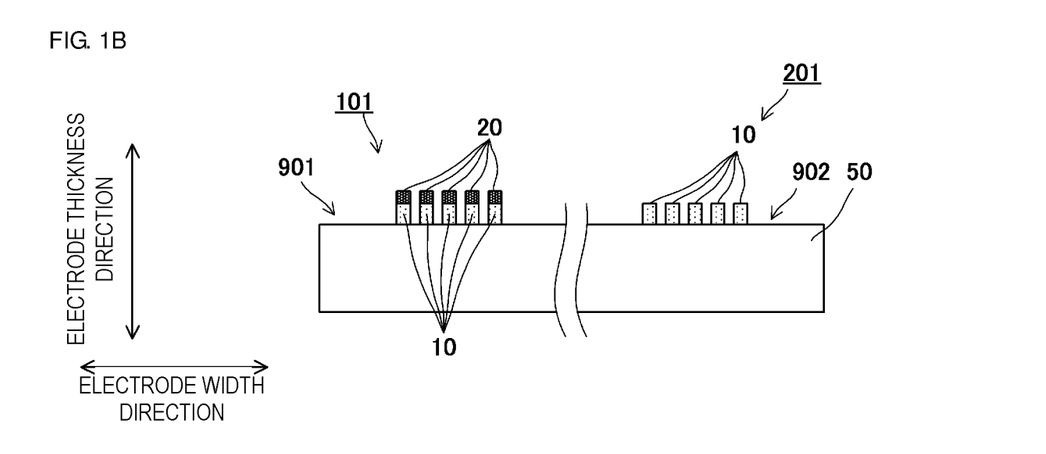
FIG. 1B is a sectional view of the elastic wave device illustrating the thickness of each IDT.

An elastic wave device 300 according to a preferred embodiment of the present invention will be described with reference to FIGS. 1A and 1B. FIG. 1A is a plan view of the elastic wave device 300, and FIG. 1B is a sectional view of the elastic wave device 300 illustrating the thickness of each IDT (interdigital transducer: comb-shaped electrode). Note that FIG. 1B is a sectional view in which a portion of a sectional view taken along line A-A and a portion of a sectional view taken along line B-B are shown next to each other to facilitate comparison between the thickness of an IDT 101 and the thickness of an IDT 201, and differs from a sectional view of the actual elastic wave device 300. Although the elastic wave device 300 of the present preferred embodiment preferably is a duplexer, the elastic wave devices of preferred embodiments of the present invention are not limited to a duplexer, and may instead be a filter, a triplexer, or a multiplexer, for example.

The elastic wave device 300 includes a surface acoustic wave filter including two pass bands and separates a transmission signal and a reception signal from each other. As illustrated in FIG. 1A, the elastic wave device 300 includes a plurality of IDTs 101, 105, 201, and 205. The thickness of the IDTs 101 and 105 differs from the thickness of the IDTs 201 and 205 so that the elastic wave device 300 includes two pass bands.

More specifically, as illustrated in FIG. 1A, the elastic wave device 300 includes a piezoelectric substrate 50 including a principal surface on which the IDTs 101, 105, 201, and 205 are formed. The piezoelectric substrate 50 contains crystals of, for example, lithium tantalate (LiTaO$_3$) and lithium niobate (LiNbO$_3$), and is piezoelectric.

As illustrated in FIG. 1A, the IDTs 101 and 105 are arranged in region 901 on the principal surface of the piezoelectric substrate 50, and the IDTs 201 and 205 are arranged in region 902 on the principal surface of the piezoelectric substrate 50. The principal surface of the piezoelectric substrate 50 is divided into regions 901 and 902 by an imaginary dividing line DL.

The IDT 101 includes two electrodes. One electrode is connected to a pad electrode 102, and the other electrode is connected to a pad electrode 103. Similarly, one electrode of the IDT 105 is connected to a pad electrode 106, and the other electrode of the IDT 105 is connected to a pad electrode 107. One electrode of the IDT 201 is connected to a pad electrode 202, and the other electrode of the IDT 201 is connected to a pad electrode 203. One electrode of the IDT 205 is connected to a pad electrode 206, and the other electrode of the IDT 205 is connected to a pad electrode 207. In practice, each IDT electrode includes a greater number of electrode fingers than in FIG. 1A.

The pad electrodes 103, 107, 203, and 207 are grounded by vias (not shown). The pad electrode 102 is connected to a terminal 102P. The terminal 102P is connected to a transmission circuit (not shown), and a transmission signal is input thereto. The pad electrode 202 is connected to a terminal 202P. The terminal 202P is connected to a reception circuit (not shown), and a reception signal is output therefrom. The pad electrode 106 and the pad electrode 206 are connected to a terminal 106P. The terminal 106P is connected to an antenna (not shown).

In the elastic wave device 300, the shape, electrode interval, and thickness of the IDTs 101 and 105 are set so that a component of the transmission signal output from the terminal 102P passes from the IDT 101 to the IDT 105, the component having a first pass band. Similarly, the shape, electrode interval, and thickness of the IDTs 201 and 205 are set so that a component of the reception signal input to the terminal 106P from the antenna (not shown) passes from the IDT 205 to the IDT 201, the component having a second pass band. The first pass band is set to, for example, about 1,920 MHz to about 1,980 MHz, which is a transmission band of band 1 in the long term evolution (LTE) standard. The second pass band is set to, for example, about 2,110 MHz to about 2,170 MHz, which is a reception band of band 1 in the LTE standard.

The thickness of the IDTs 101 and 105 differs from the thickness of the IDTs 201 and 205 so that the elastic wave device 300 includes the first pass band and the second pass band.

More specifically, as illustrated in FIG. 1B, the IDT 101 is thicker than the IDT 201. Although not illustrated, the thickness of the IDT 105 is the same as that of the IDT 101, and the thickness of the IDT 205 is the same as that of the IDT 201.

The IDT 101 is formed by stacking a first layer 10 and a second layer 20 on the principal surface of the piezoelectric substrate 50 in that order. The IDT 201 includes only the first layer 10 on the principal surface of the piezoelectric substrate 50.

In the elastic wave device 300 according to the present preferred embodiment, the errors in the first and second pass bands are significantly reduced or minimized by significantly reducing or minimizing the errors in the electrode widths of the IDTs. In other words, in the elastic wave device 300 according to the present preferred embodiment, the errors in the first and second pass bands are significantly reduced or minimized by significantly reducing or minimizing the errors in the distances between the electrode fingers of the IDTs.

Figure 2:
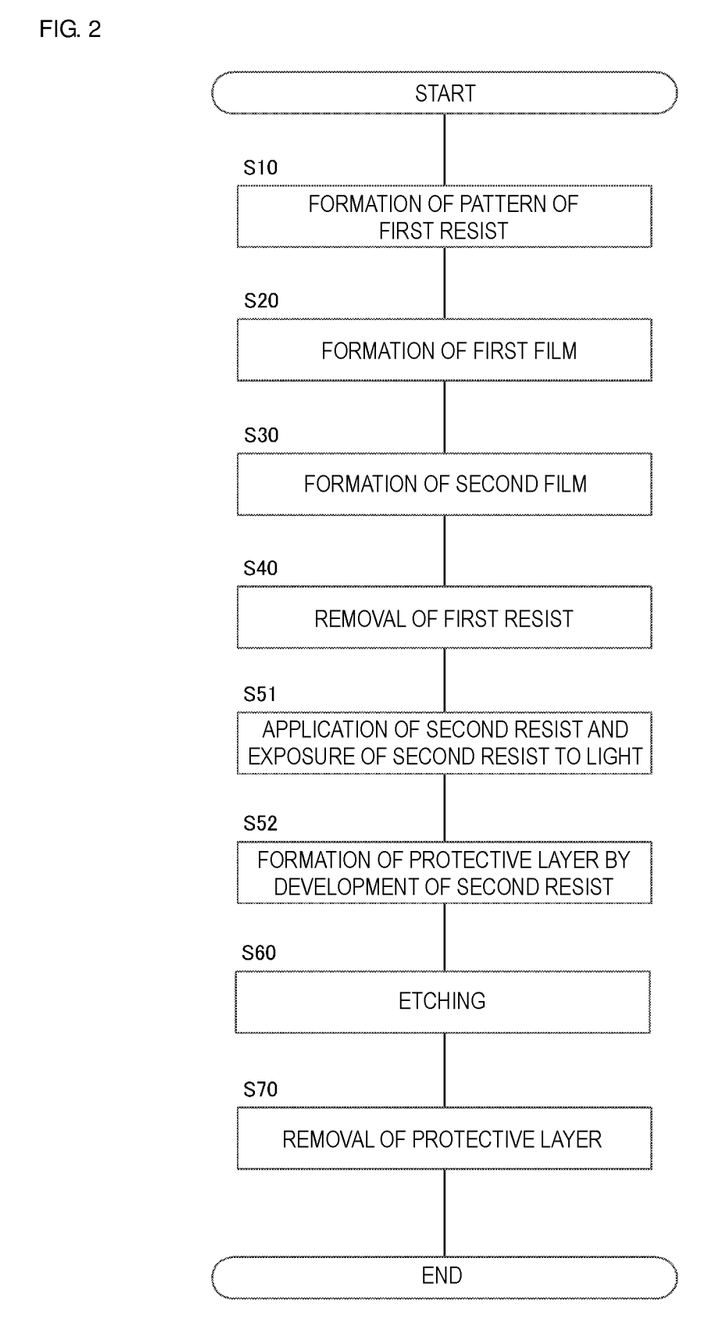
FIG. 2 is a flowchart illustrating the steps of a method for manufacturing the elastic wave device according to a preferred embodiment of the present invention.

Next, a method for manufacturing the elastic wave device 300 will be described with reference to FIG. 2. FIG. 2 is a flowchart illustrating the steps of manufacturing the elastic wave device 300.

First, a pattern of a first resist is formed (S10).

Figure 3A:
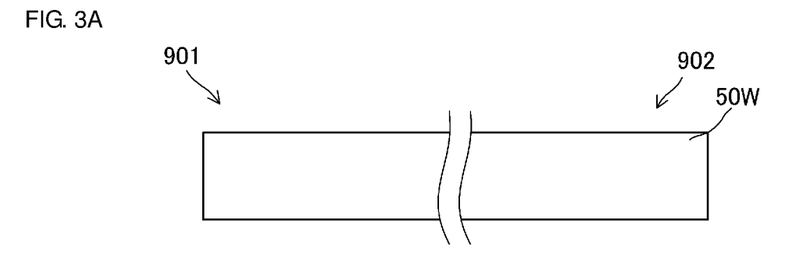
FIGS. 3A to 3D illustrate steps of forming a pattern of a first resist.
Figure 3B:
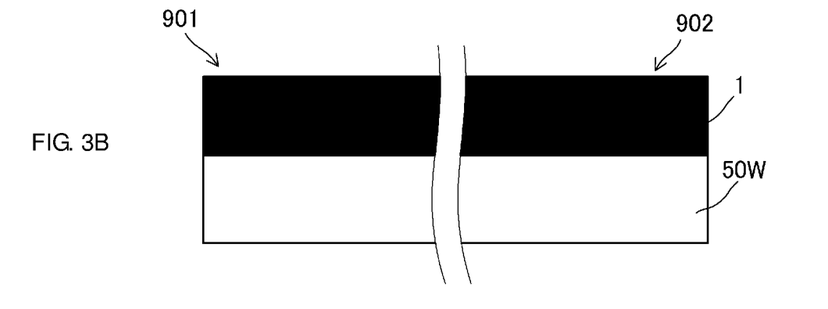
Figure 3C:
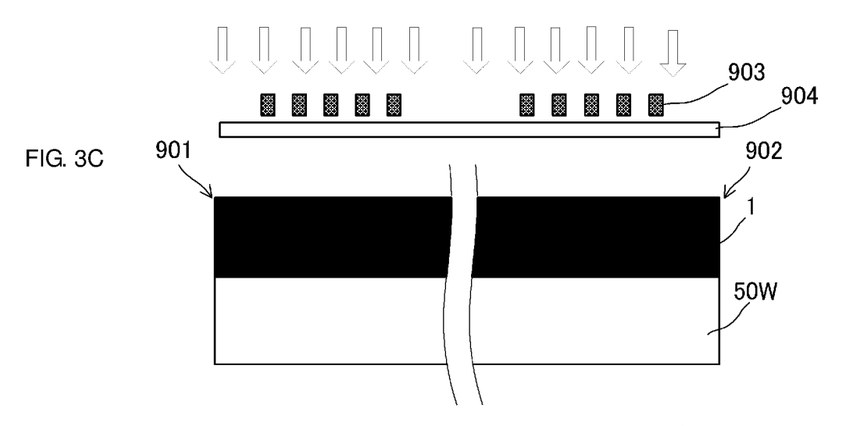
Figure 3D:
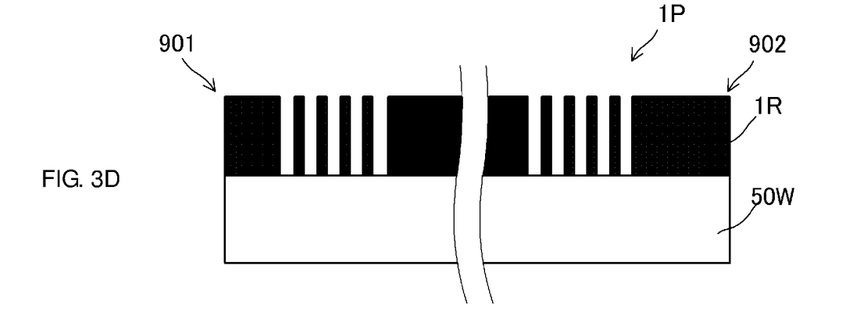

More specifically, as illustrated in FIG. 3A, a wafer 50W, which serves a plurality of piezoelectric substrates 50, is prepared. Then, as illustrated in FIG. 3B, a first resist 1 is applied to a mirror-finished principal surface of the wafer 50W. Then, as illustrated in FIG. 3C, the first resist 1 is exposed to light. A stepper, for example, is used as an exposure device. The first resist 1 is irradiated with ultraviolet (UV) light through a photomask 903 and a projection lens 904 disposed above the wafer 50W. Then, as illustrated in FIG. 3D, the first resist 1 is developed. As a result, a pattern 1P, in which first resist 1R remains in areas irradiated with the UV light and in which the first resist 1 is removed in areas not irradiated with the UV light, is formed on the wafer 50W.

Figure 4A:
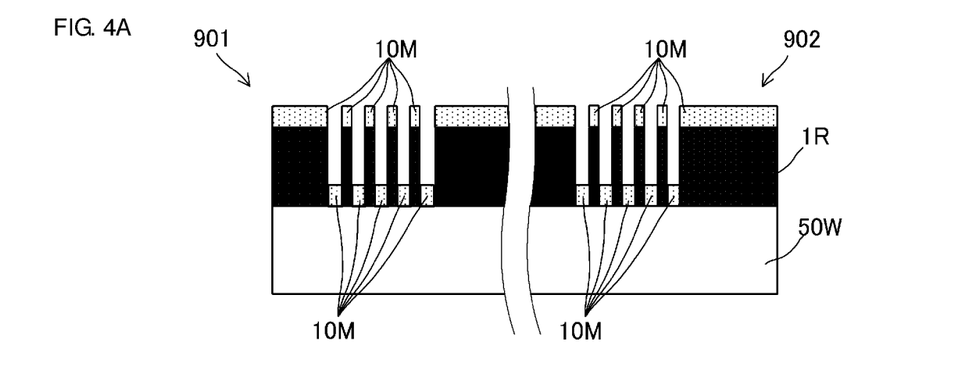
FIG. 4A illustrates a first-film forming step.

Referring to FIG. 2 again, after the pattern of the first resist 1 is formed (S10), a first film 10M is formed on the wafer 50W on which the pattern 1P of the first resist 1R is formed (S20). The first film 10M contains, for example, aluminum (Al). The first film 10M is formed by, for example, electron beam vapor deposition. The thickness of the first film 10M is adjusted to about 250 nm, for example. As a result, as illustrated in FIG. 4A, the first film 10M is formed on upper and lower portions of the pattern 1P. The upper portion of the pattern 1P is the top surface of the first resist 1R, and the lower portion of the pattern 1P is a portion of the principal surface of the wafer 50W that is not covered with the first resist 1R.

The film is formed by vacuum deposition, so that the thickness thereof can be precisely adjusted on the order of about 1 nm, for example. A correction plate may be used to increase the uniformity of the film thickness along the plane of the wafer 50W.

Figure 4B:
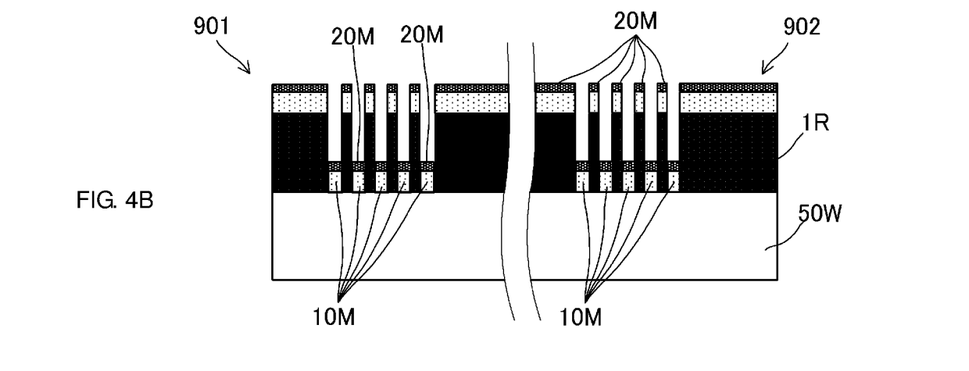
FIG. 4B illustrates a second-film forming step.

Then, a second film 20M is formed on the first film 10M (S30). More specifically, the second film 20M is formed on the first film 10M without applying a resist on the first film 10M. The second film 20M contains, for example, copper (Cu). Tungsten (Ta) or nickel (Ni) may instead be used as a conductive material of the second film 20M. As illustrated in FIG. 4B, the second film 20M is formed on the first film 10M that is formed on the upper and lower portions of the pattern 1P. The second film 20M is also formed by, for example, electron beam vapor deposition. The thickness of the second film 20M is adjusted to about 20 nm, for example.

Figure 4C:
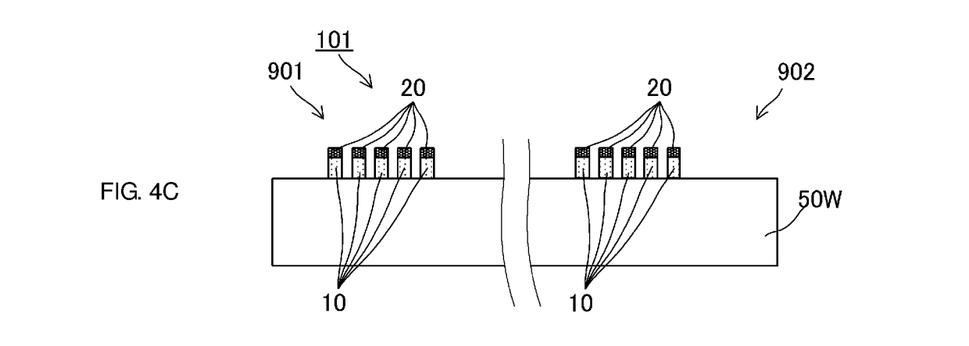
FIG. 4C illustrates a first-resist removing step.

After the second film 20M is formed (S30), the first resist 1R is removed (S40). More specifically, the first resist 1R is removed from the wafer 50W by using a developer. Accordingly, as illustrated in FIG. 4C, the films formed on the upper portion of the pattern 1P are removed from the wafer 50W together with the first resist 1R. The multilayer electrodes including the first layer 10 and the second layer 20 formed on the lower portion of the pattern 1P remain on the wafer 50W after the development of the first resist 1R. More specifically, the multilayer electrodes including the first layer 10 and the second layer 20 that remain in region 901 on the principal surface of the wafer 50W define and function as the IDTs 101 and 105.

Although not illustrated, after the first resist 1R is removed (S40), the pad electrodes 102, 103, 106, 107, 202, 203, 206, and 207 and the terminals P102P, 202P, and 106P are formed, and wires to connect the pad electrodes to the corresponding terminals are also formed. Also, a metal layer pattern is formed on electrode portions other than the IDTs 101, 105, 201, and 205 in order to, for example, reduce the resistance.

Figure 5A:
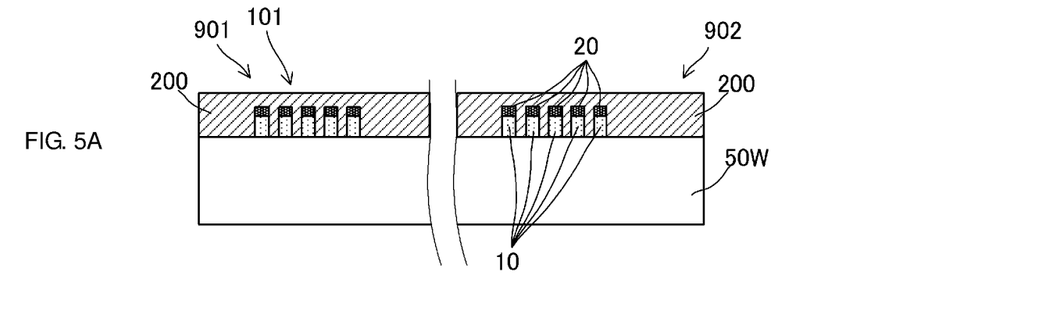
FIGS. 5A and 5B illustrate the steps of forming a protective layer made of a second resist.

Referring to FIG. 2 again, after the first resist 1R is removed (S40), a protective layer made of a second resist 200 is formed (S51 and S52). More specifically, first, as illustrated in FIG. 5A, the second resist 200 is applied to the wafer 50W. The thickness of the second resist 200 is adjusted so that the IDTs 101 and 105 and the multilayer bodies including the first layer 10 and the second layer 20 in region 902 are covered with the second resist 200.

Figure 5B:
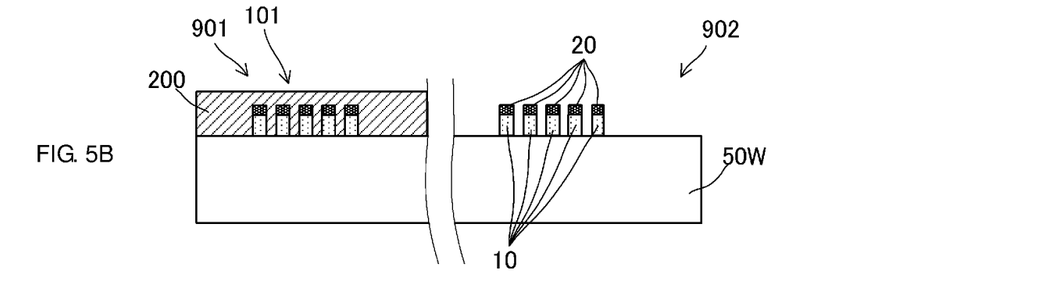

Next, the second resist 200 is subjected to exposure and development. An aligner exposure device, for example, may be used as an exposure device. In the case where the second resist 200 is a positive resist, the second resist 200 is exposed to light by using a photomask having such a pattern that the light is blocked in region 901 and transmitted in region 902. When the development is performed after the exposure, the second resist 200 remains on the wafer 50W in region 901, and is removed from the wafer 50W in region 902. As a result, as illustrated in FIG. 5B, the second resist 200 remains on the wafer 50W while the IDTs 101 and 105 are covered with the second resist 200 in region 901, and is removed in region 902. Thus, a protective layer made of the second resist 200 that protects the IDTs 101 and 105 is formed. The second resist 200 is removed in region 902, so that the multilayer bodies formed of the first layer 10 and the second layer 20 in region 902 are exposed.

Figure 5C:
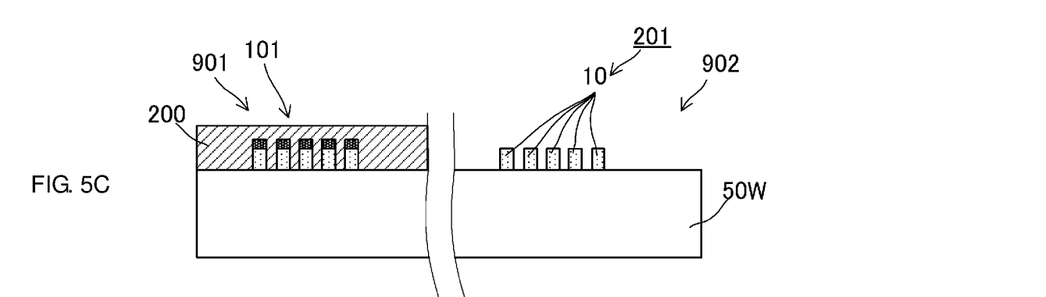
FIG. 5C illustrates an etching step.

Next, the conductive material on the wafer 50W is etched (S60). An etchant that dissolves the conductive material of the second layer 20 is used. Here, iron(II) chloride ($FeCl_2$) is used as an etchant for dissolving copper (Cu). As a result, as illustrated in FIG. 5C, the second layer 20 in region 902 is removed. The electrodes formed of the first layer 10 that remains in region 902 define and function as the IDTs 201 and 205.

Figure 5D:
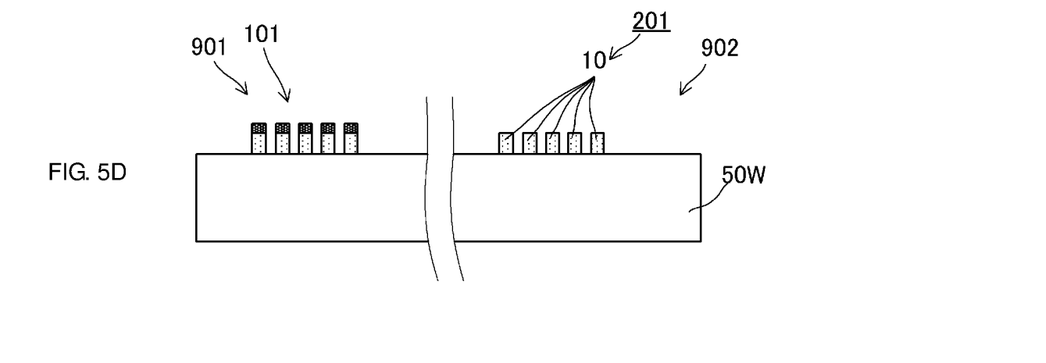
FIG. 5D illustrates a protective-layer removing step.

Finally, the protective layer made of the second resist 200 in region 901 is removed (S70).

Although not illustrated, after that, the principal surface of the wafer 50W on which the IDTs 101, 105, 201, and 205 are formed is covered with a protective film made of silicon oxide (SiO$_2$) to prevent a change in characteristics due to exposure to an external environment. Then, the pass bands are measured, and are adjusted by reducing the thickness of the electrode protective film by dry etching. The protective film made of silicon oxide preferably has a thickness greater than the desired thickness. In the case where the protective film has a thickness greater than the desired thickness, even if there are differences between batches when the IDTs 101, 105, 201, and 205 are formed, the pass bands can be easily adjusted by adjusting the amount by which the thickness of the protective film is reduced.

The thickness of the protective film, the amount by which the thickness of the protective film is reduced, and the difference in thickness between the IDTs may be set in advance in consideration of the fact that the amounts by which the pass bands are shifted relative to the amount by which the thickness of the protective film is reduced are inversely proportional to the weights of the IDT electrodes. In such a case, the thickness adjustment for the protective film is able to be performed for the entire principal surface of the wafer 50W simultaneously instead of performing the thickness adjustment for each region of the principal surface of the wafer 50W.

The electrode widths of the IDTs 101, 105, 201, and 205 are determined by a single exposure and a single development performed on the first resist 1 as illustrated in FIGS. 3C and 3D. In other words, according to the method for manufacturing the elastic wave device 300 illustrated in FIG. 2, the electrode widths of the IDTs 101, 105, 201, and 205 are set without performing etching to determine the electrode widths of the IDTs 101, 105, 201, and 205. In the method for manufacturing the elastic wave device 300 according to the present preferred embodiment, the electrode widths of the IDTs 101, 105, 201, and 205 are determined by a smaller number of steps compared to the method according to the related art. Therefore, the errors in the electrode widths are significantly reduced or minimized. Accordingly, the errors in the first and second pass bands due to the errors in the electrode widths are significantly reduced or minimized in the elastic wave device 300.

In addition, in this manufacturing method, multilayer bodies formed of the first layer 10 and the second layer 20 are formed in regions 901 and 902, and then the multilayer bodies in region 902 are reduced in thickness by etching. Thus, no IDTs are formed on a portion of the principal surface of the wafer 50W that has been exposed to an etchant. Therefore, in this manufacturing method, a change in characteristics of the piezoelectric substrate 50 in regions below the IDTs 101, 105, 201, and 205 due to exposure to an etchant is able to be prevented.

Figure 6:
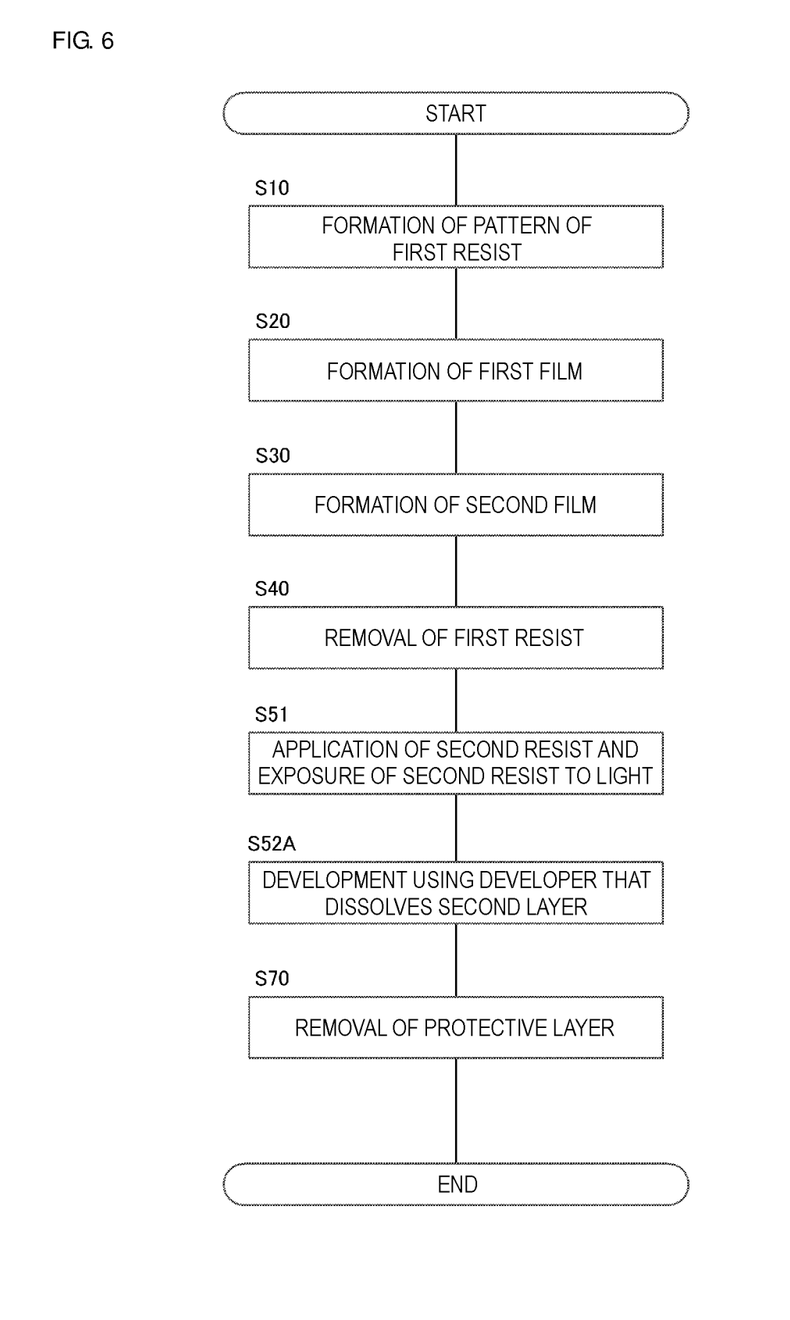
FIG. 6 is a flowchart illustrating the steps of a method for manufacturing an elastic wave device according to a first modification of a preferred embodiment of the present invention.

Next, a method for manufacturing the elastic wave device 300 according to a first modification of a preferred embodiment of the present invention will be described with reference to FIG. 6. The method for manufacturing the elastic wave device 300 according to the first modification differs from the method for manufacturing the elastic wave device 300 illustrated in FIG. 2 in that the second layer 20, which is the uppermost layer in region 902, is dissolved when the second resist 200 is developed to form the protective layer made of the second resist 200. More specifically, the method for manufacturing the elastic wave device 300 illustrated in FIG. 6 differs from the manufacturing method illustrated in FIG. 2 in that step S52A is performed instead of step S52 and step S60 is not performed.

In step S52A, development is performed by using a developer that dissolves the second resist 200 and the second layer 20. For example, when the second layer 20 is made of nickel (Ni), tetramethylammonium hydroxide (TMAH) is used as the developer.

In the method for manufacturing the elastic wave device 300 according to the first modification, formation of the protective layer made of the second resist 200 and etching of the second layer 20 in region 902 are performed simultaneously, so that the overall process is simplified.

Figure 7:
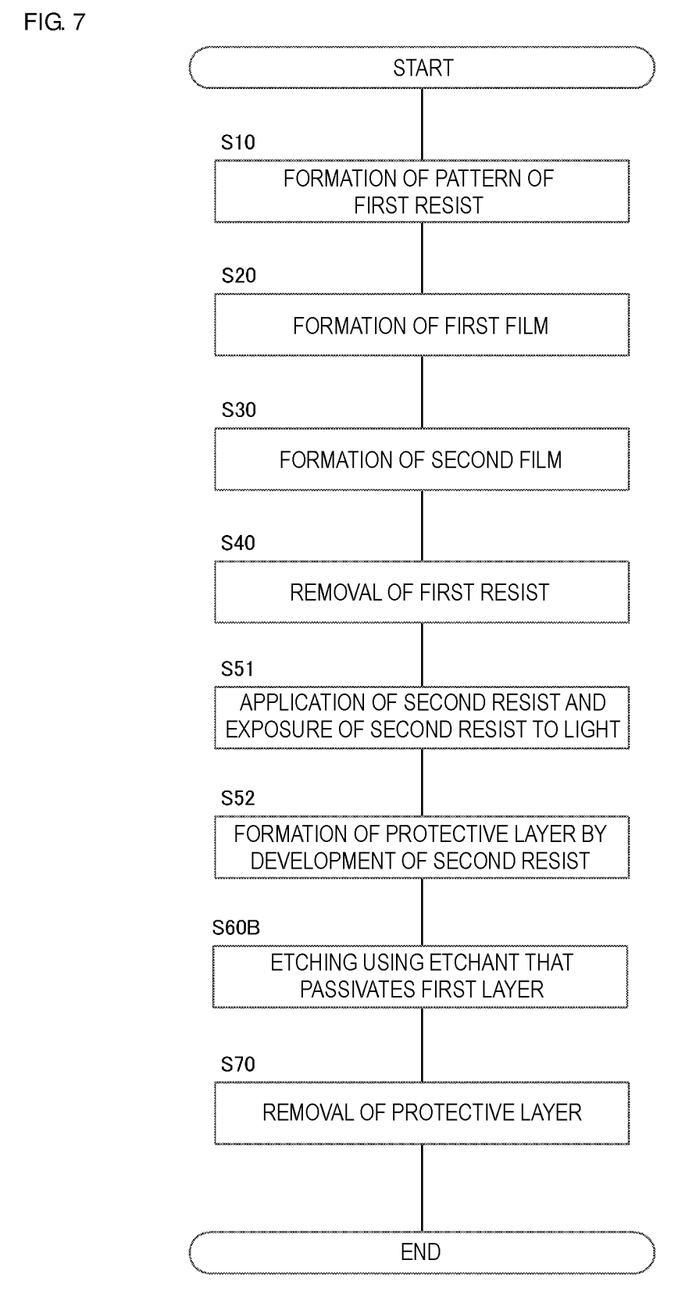
FIG. 7 is a flowchart illustrating the steps of a method for manufacturing an elastic wave device according to a second modification of a preferred embodiment of the present invention.
Figure 8:
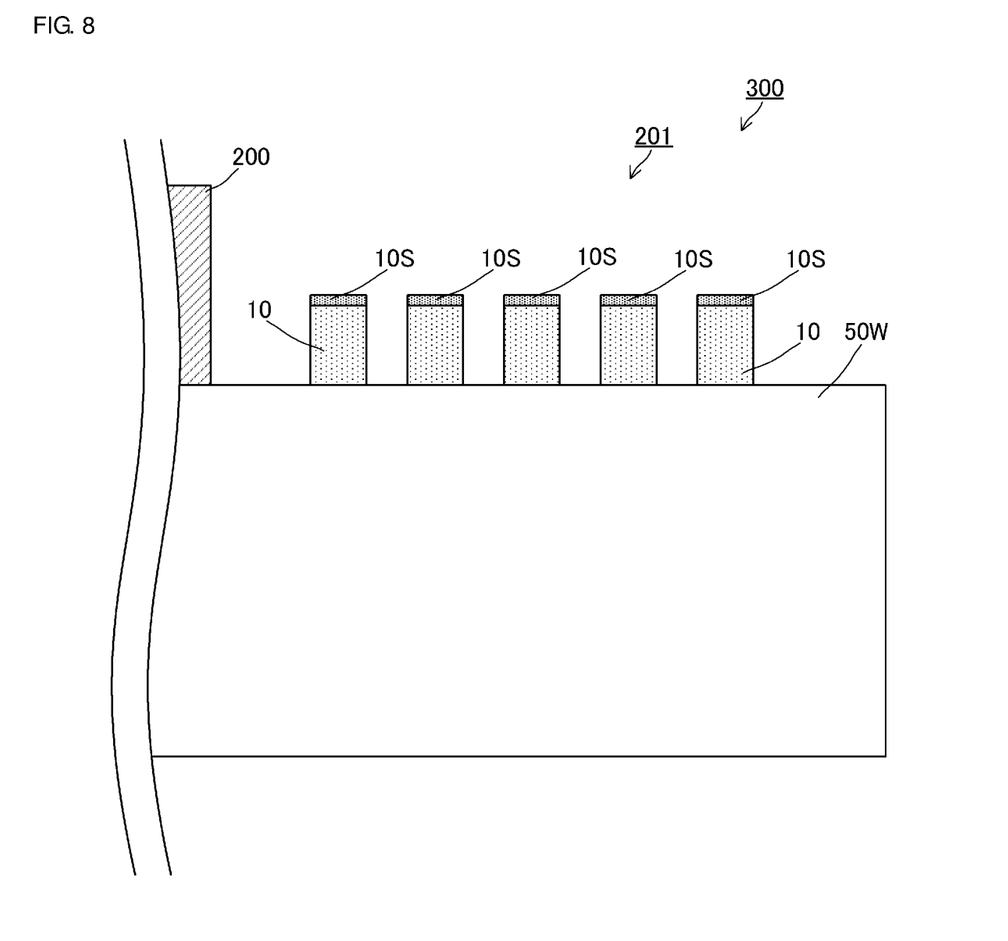
FIG. 8 illustrates an etching step of a method for manufacturing an elastic wave device according to the second modification.

A method for manufacturing the elastic wave device 300 according to a second modification of a preferred embodiment of the present invention will now be described with reference to FIGS. 7 and 8. FIG. 7 is a flowchart illustrating the steps of the method for manufacturing the elastic wave device 300 according to the second modification. FIG. 8 is a sectional view of the elastic wave device 300 illustrating the thickness of the IDT 201 in region 902.

In the method for manufacturing the elastic wave device 300 according to the second modification, the second layer 20, which is the uppermost layer in region 902, is etched by using an etchant that passivates the surface of the first layer 10, which is a lower layer adjacent to the uppermost layer, so that the thickness of the first layer 10 does not change during etching.

More specifically, as illustrated in FIG. 7, the method for manufacturing the elastic wave device 300 according to the second modification differs from the method for manufacturing the elastic wave device 300 illustrated in FIG. 2 in that step S60B is performed instead of step 60. Description of other steps that are the same as those in the method for manufacturing the elastic wave device 300 illustrated in FIG. 2 is omitted.

In step S60B, a conductive material formed on the piezoelectric substrate 50 is etched by using an etchant that dissolves the second layer 20 and passivates the conductive material of the first layer 10. When, for example, the first layer 10 is made of titanium (Ti) and the second layer 20 is made of copper (Cu), an etchant containing nitric acid (HNO$_3$) is used. The nitric acid dissolves the copper and oxidizes the surface of the first layer 10 made of titanium. Accordingly, as illustrated in FIG. 8, an oxidized layer 10S is formed on the surface of the first layer 10. The oxidized layer 10S is resistant to etching, and prevents the first layer 10 from being dissolved by the etchant that dissolves the second layer 20. In other words, the oxidized layer 10S defines and functions as an etching stop layer for the first layer 10. Since the etchant that dissolves the second layer 20 makes it more difficult for the first layer 10 to be dissolved, the thickness of the first layer 10 does not easily change. Therefore, according to the method for manufacturing the elastic wave device 300 of the second modification, the electrode thickness of the IDTs 201 and 205 in region 902 is able to be more precisely set to the desired thickness.

The material that can be easily passivated is not limited to nickel, and may instead be tungsten (W), aluminum (Al), titanium (Ti), or chromium (Cr).

It is not necessary to form the etching stop layer by changing the surface of the first layer 10 into the oxidized layer 10S with the etchant containing a component having an oxidizing function as in the above-described example. When a noble metal is used as the conductive material of the first layer 10, the film thickness of the first layer 10 does not easily change during etching of the second layer 20 in region 902 regardless of the use of the etchant containing a component having an oxidizing function. In other words, when the first layer 10, which is disposed below the second layer 20 to be removed by etching to create a difference in electrode thickness between the IDTs 101 and 201, is made of a noble metal, the thickness of the first layer 10 does not easily change when etching is performed to create a difference in electrode thickness.

In the method for manufacturing the elastic wave device 300, the noble metal that defines and functions as the etching stop layer is selected from those having high selectivity ratios for an etchant for a conductive material such as aluminum (Al), titanium (Ti), copper (Cu), tungsten (W), or tantalum (Ta). For example, platinum (Pt), palladium (Pd), or gold (Au) may be used as the noble metal.

Figure 9A:
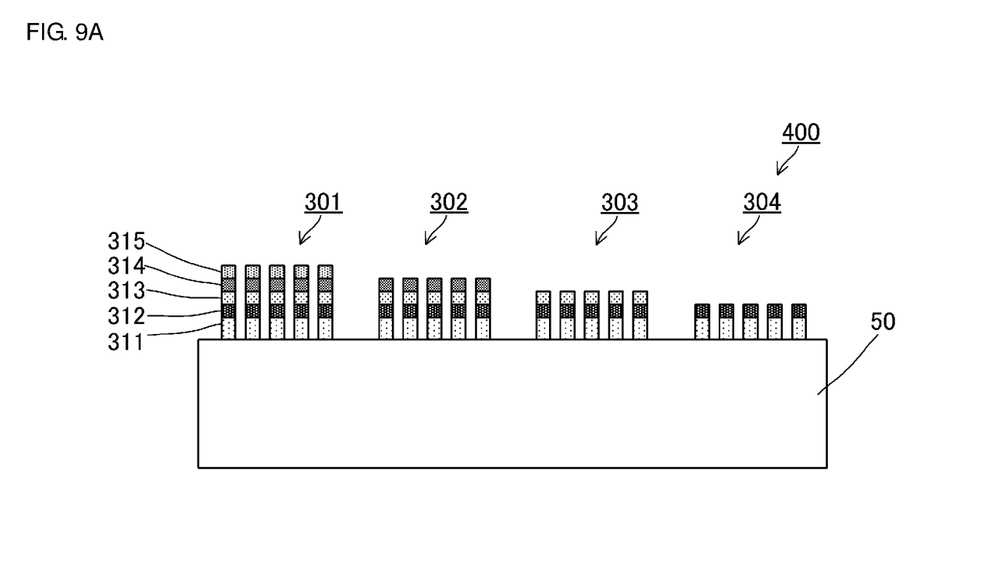
FIG. 9A is a sectional view of an elastic wave device including four pass bands.
Figure 9B:
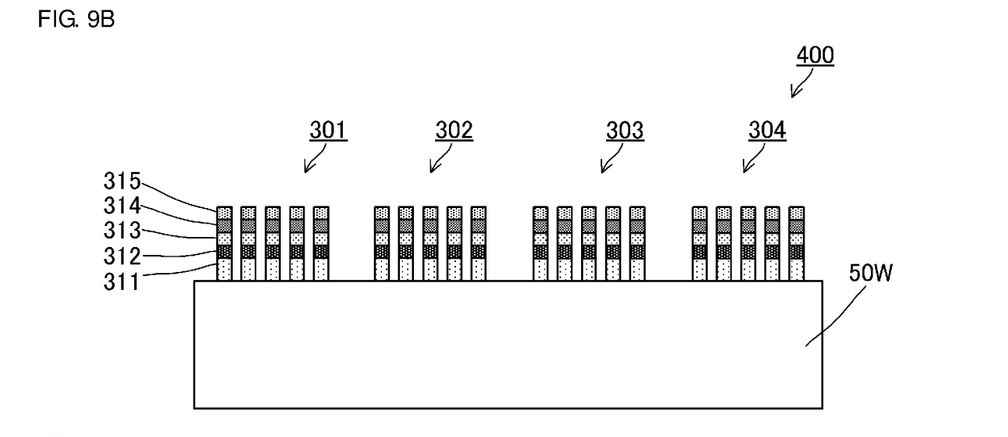
FIG. 9B is a sectional view of the elastic wave device before an adjustment of the thickness of each IDT.

An elastic wave device 400 described below may be manufactured by repeating the above-described steps. FIG. 9A is a sectional view of the elastic wave device 400 illustrating the thicknesses of IDTs 301, 302, 303, and 304. FIG. 9B is a sectional view of the elastic wave device 400 before an adjustment of the electrode thicknesses.

The elastic wave device 400 is a so-called surface acoustic wave filter. As illustrated in FIG. 9A, the IDTs 301, 302, 303, and 304 have different thicknesses. The IDT 301 is the thickest, followed in order by the IDTs 302, 303, and 304.

More specifically, the IDT 301 includes a first layer 311, a second layer 312, a third layer 313, a fourth layer 314, and a fifth layer 315 stacked on a principal surface of a wafer 50W in that order. The IDT 302 has a multilayer structure obtained by removing the fifth layer 315 from the multilayer structure of the IDT 301. The IDT 303 has a multilayer structure obtained by removing the fourth layer 314 from the multilayer structure of the IDT 302. The IDT 304 has a multilayer structure obtained by removing the third layer 313 from the multilayer structure of the IDT 303.

In a method for manufacturing the elastic wave device 400, first, a lower portion of the pattern of the IDTs 301, 302, 303, and 304 is formed on the principal surface of the wafer 50W by using a first resist 1 (step corresponding to step S10 in FIG. 2). Then, a first film made of aluminum (e.g., about 250 nm), a second film made of platinum (e.g., about 10 nm), a third film made of copper (e.g., about 20 nm), a fourth film made of nickel (e.g., about 20 nm), and a fifth film made of copper (e.g., about 5 nm) are successively formed on the wafer 50W (repetition of steps corresponding to steps S20 and S30). In the case where a plurality of films are made of the same conductive material, thinner films are preferably formed closer to the front surface to reduce the influence of side etching.

After that, the first resist is removed (S40), so that an electrode pattern in which the first to fifth layers 311 to 315 are stacked is formed on the principal surface of the wafer 50W, as illustrated in FIG. 9B. The IDT 301 is formed at this time.

Then, the step of forming a protective layer with a second resist in a region to be protected from etching (steps S51, S52, and S70) and an etching step (S60) are repeated to successively remove the layers of the electrodes from the outermost layer in each region of the electrode pattern. More specifically, to manufacture the elastic wave device 400 illustrated in FIG. 9A, the following steps are performed on the structure illustrated in FIG. 9B.

A protective layer is formed in the regions in which the IDTs 301 and 303 are to be formed. Then, a conductive material formed on the wafer 50W is etched with an etchant containing nitric acid. Accordingly, the fifth layer 315 (copper) is removed in the regions in which the IDTs 302 and 304 are to be formed. In this etching step, the surface of the fourth layer 314 (nickel) that is below the fifth layer 315 is passivated by the nitric acid in the regions in which the IDTs 302 and 304 are to be formed.

Next, the protective layer is removed, and a protective layer is formed again in the regions in which the IDTs 301 and 302 are to be formed. At this time, tetramethylammonium hydroxide is used as a developer for the second resist. Accordingly, when the protective layer made of the second resist is formed, the fourth layer 314 (nickel) in the region in which the IDT 304 is to be formed is removed at the same time.

Next, the wafer 50W is exposed to an etchant containing nitric acid without removing the protective layer in the regions in which the IDTs 301 and 302 are to be formed. As a result, the fifth layer 315 (copper) in the region in which the IDT 303 is to be formed and the third layer 313 (copper) in the region in which the IDT 304 is to be formed are dissolved. The second layer 312 (platinum) that is below the third layer 313 in the region in which the IDT 304 is to be formed is hardly dissolved because the second layer 312 is made of a noble metal.

Finally, the wafer 50W is exposed to tetramethylammonium hydroxide to remove the protective layer in the regions where the IDTs 301 and 302 are to be formed. At this time, the fourth layer (nickel) in the region where the IDT 303 is to be formed is removed from the wafer 50W together with the protective layer.

Figure 10:
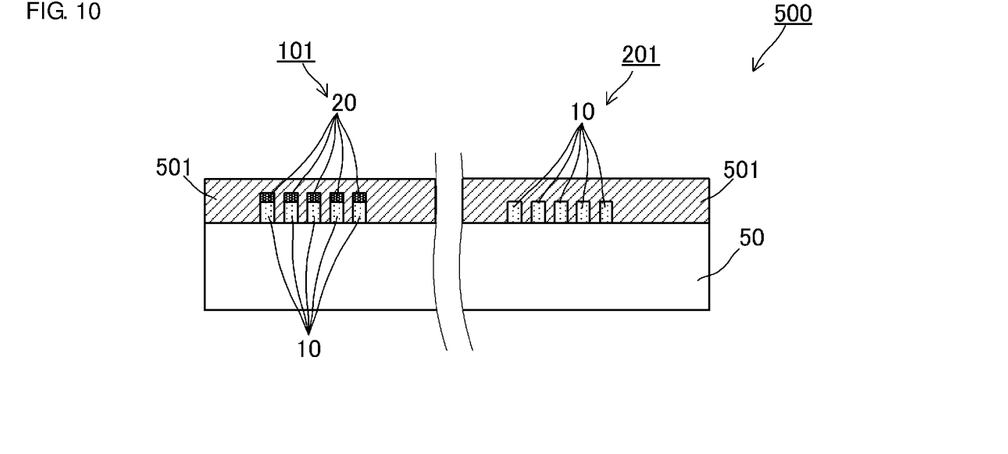
FIG. 10 is a sectional view of an elastic wave device.

The above-described manufacturing method may also be applied to an elastic wave device 500 illustrated in FIG. 10. The elastic wave device 500 preferably is a boundary acoustic wave filter. More specifically, the IDTs 101 and 105 and the IDTs 201 and 205, which have different thicknesses, are formed on the principal surface of the wafer 50W by the above-described manufacturing method, and then a dielectric layer 501 is formed on the principal surface of the wafer 50W so as to cover the IDTs 101, 105, 201, and 205. Silicon oxide (SiO2), for example, may be used as the material of the dielectric layer 501.

Figure 11:
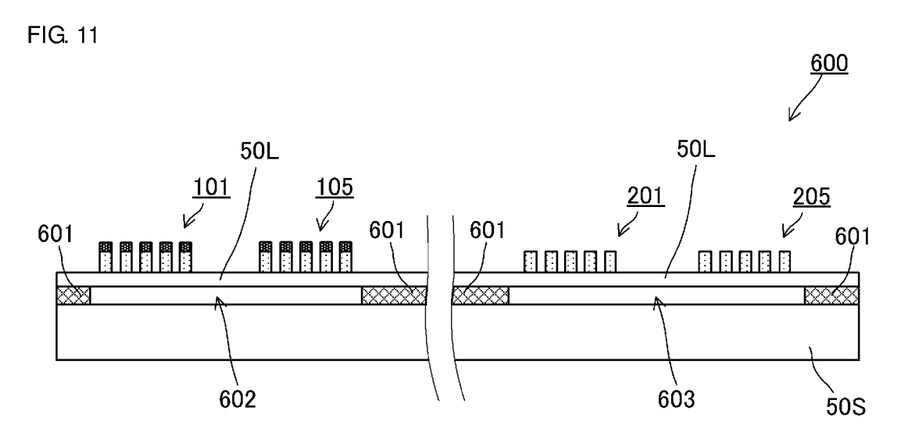
FIG. 11 is a sectional view of an elastic wave device.

The above-described manufacturing method may also be applied to, for example, an elastic wave device 600 illustrated in FIG. 11. The elastic wave device 600 is a so-called elastic plate wave filter. More specifically, supports 601 are formed on a principal surface of a support substrate 50S in predetermined regions, and a piezoelectric film 50L made of a piezoelectric material is formed so as to cover the principal surface of the support substrate 50S on which the supports 601 are formed. Accordingly, as illustrated in FIG. 11, hollow portions 602 and 603 surrounded by the support substrate 50S, the supports 601, and the piezoelectric film 50L are formed. Then, IDTs 101, 105, 201, and 205 are formed by the above-described manufacturing method on a surface of the piezoelectric film 50L at a side opposite to the side at which the support substrate 50S is provided. More specifically, the IDTs 101 and 105 are formed in a region that overlaps the hollow portion 602 in plan view of the elastic wave device 600. The IDTs 201 and 205 are formed in a region that overlaps the hollow portion 603 in plan view of the elastic wave device 600.

Figure 12A:
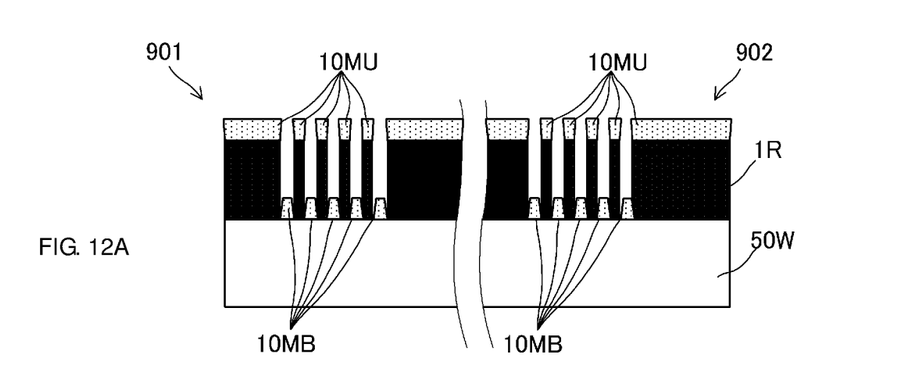
FIGS. 12A and 12B illustrate the detailed cross-sectional shapes of metal films in a film forming step.
Figure 12B:
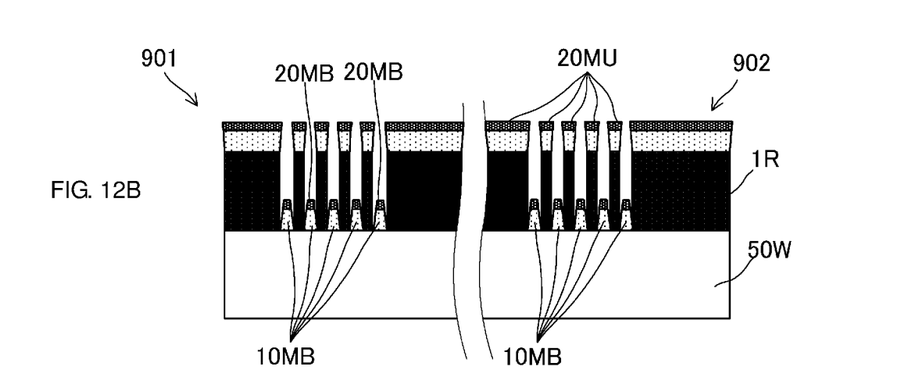

When all of the electrode layers are stacked after the first resist 1R is formed as described above, each IDT is tapered such that the width thereof decreases with increasing distance in a direction away from the piezoelectric substrate 50 in cross section. This will be described with reference to FIGS. 12A and 12B. FIG. 12A illustrates the detailed cross-sectional shape of a metal film in a film forming step for forming the first film 10M. FIG. 12B illustrates the detailed cross-sectional shape of a metal film in a film forming step for forming the second film 20M.

As illustrated in FIG. 12A, when the first film 10M is formed on the principal surface of the piezoelectric substrate 50 covered with the first resist 1R by electron beam vapor deposition, the first film 10MU formed on the upper portion of the first resist 1R has a reverse tapered shape such that the width thereof increases with increasing distance in the direction away from the piezoelectric substrate 50. As the first film 10MU having the reverse tapered shape is formed, the first film 10MU having the reverse tapered shape defines and functions as a block for the portions of the principal surface of the piezoelectric substrate 50 that are not covered with the first resist 1R. Accordingly, the first film 10MB is formed in a forward tapered shape such that the width thereof decreases with increasing distance in the direction away from the piezoelectric substrate 50.

As illustrated in FIG. 12B, when the second film 20M is formed, the second film 20MU formed on the first film 10MU has a reverse tapered shape such that the width thereof increases with increasing distance in the direction away from the piezoelectric substrate 50. As the second film 20MU having the reverse tapered shape is formed, the second film 20MU having the reverse tapered shape defines and functions as a block so that the second film 20MB is formed on the first film 10MB in a forward tapered shape such that the width thereof decreases with increasing distance in the direction away from the piezoelectric substrate 50.

Figure 13A:
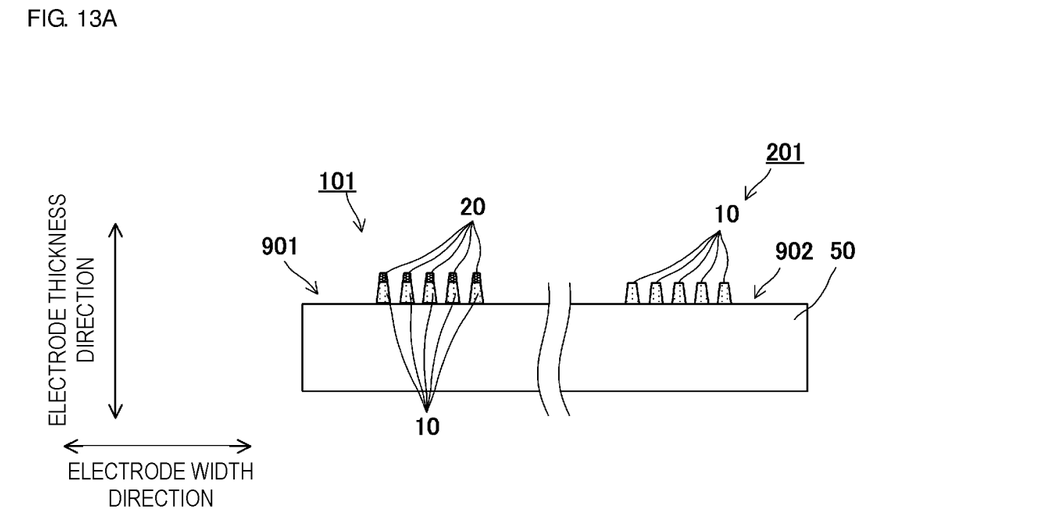
FIG. 13A illustrates the detailed cross-sectional shape of each IDT.

Then, after the subsequent steps, as illustrated in FIG. 13A, the IDTs 101, 105, 201, and 205 are formed in a forward tapered shape such that the width thereof decreases with increasing distance in the direction away from the piezoelectric substrate 50.

Figure 13B:
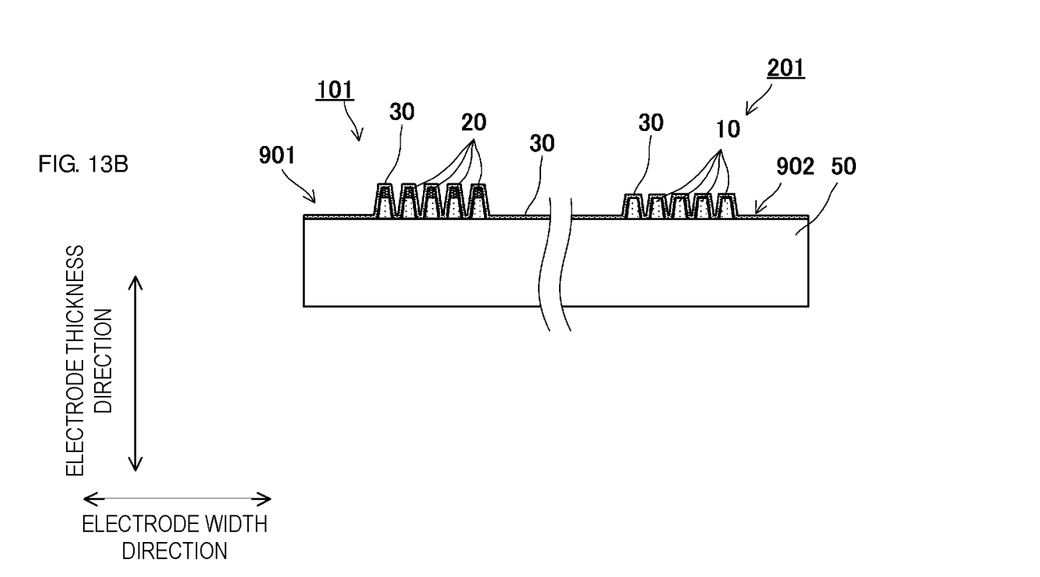
FIG. 13B is a sectional view of an elastic wave device covered with an insulating layer.

In general, the principal surface of the piezoelectric substrate may be covered with an insulating layer to protect each IDT from the external environment. FIG. 13B is a sectional view of the elastic wave device 300 covered with an insulating layer 30. The insulating layer 30 illustrated in FIG. 13B is formed by, for example, applying an insulating material to the principal surface of the piezoelectric substrate 50. The insulating material can be easily applied to the side surface of each IDT since the IDTs 101, 105, 201, and 205 have a forward tapered shape. Accordingly, each IDT is able to be reliably covered with the insulating layer 30. In other words, the insulation reliability of the insulating layer 30 is increased due to the forward tapered shape of the IDTs 101, 105, 201, and 205.

In general, when an IDT is oxidized as a result of insufficient insulation, the resonant frequency of the IDT is shifted toward the low-frequency side due to a change in the weight of the IDT. When IDTs made of different conductive materials and with different thicknesses are provided, the weights thereof change by different amounts. As a result, the amount by which the resonant frequency is shifted differs for each of the IDTs made of different conductive materials and with different thicknesses.

The elastic wave device 300 according to the present preferred embodiment is covered with the insulating layer 30 having high insulation reliability. Accordingly, the change in weight of each IDT due to oxidization of the IDT is reduced, and differences between the IDTs in the amount by which the resonant frequency is shifted due to the change in weight are also reduced.

Combinations of conductive materials of the IDTs will now be described. Table 1 shows combinations of conductive materials of two types of IDTs with different thicknesses.

TABLE 1

| First Comb-Shaped Electrode | Second Comb-Shaped Electrode |
| --- | --- |
| Cu/Al/Substrate | Al/Substrate |
| Ti/Al/Substrate | Al/Substrate |
| Ni/Al/Substrate | Al/Substrate |
| Cu/Pt/Substrate | Pt/Substrate |
| Ti/Pt/Substrate | Pt/Substrate |
| Ni/Pt/Substrate | Pt/Substrate |
| Al/Pt/Substrate | Pt/Substrate |

Table 2 shows combinations of conductive materials of three types of IDTs with different thicknesses.

TABLE 2

| First Comb-Shaped Electrode | Second Comb-Shaped Electrode | Third Comb-Shaped Electrode |
| --- | --- | --- |
| Cu/Ti/Al/Substrate | Ti/Al/Substrate | Al/Substrate |
| Cu/Ni/Al/Substrate | Ni/Al/Substrate | Al/Substrate |
| Ti/Cu/Al/Substrate | Cu/Al/Substrate | Al/Substrate |
| Ti/Ni/Al/Substrate | Ni/Al/Substrate | Al/Substrate |
| Cu/Ti/Al/Substrate | Ti/Al/Substrate | Al/Substrate |
| Cu/Ni/Al/Substrate | Ni/Al/Substrate | Al/Substrate |
| Ni/Cu/Al/Substrate | Cu/Al/Substrate | Al/Substrate |
| Ni/Ti/Al/Substrate | Ti/Al/Substrate | Al/Substrate |
| Cu/Ti/Pt/Substrate | Ti/Pt/Substrate | Pt/Substrate |
| Cu/Ni/Pt/Substrate | Ni/Pt/Substrate | Pt/Substrate |
| Cu/Al/Pt/Substrate | Al/Pt/Substrate | Pt/Substrate |
| Ti/Cu/Pt/Substrate | Cu/Pt/Substrate | Pt/Substrate |
| Ti/Ni/Pt/Substrate | Ni/Pt/Substrate | Pt/Substrate |
| Ti/Al/Pt/Substrate | Al/Pt/Substrate | Pt/Substrate |
| Cu/Ti/Pt/Substrate | Ti/Pt/Substrate | Pt/Substrate |
| Cu/Ni/Pt/Substrate | Ni/Pt/Substrate | Pt/Substrate |
| Cu/Al/Pt/Substrate | Al/Pt/Substrate | Pt/Substrate |
| Ni/Ti/Pt/Substrate | Ti/Pt/Substrate | Pt/Substrate |
| Ni/Cu/Pt/Substrate | Cu/Pt/Substrate | Pt/Substrate |

Table 3 shows combinations of conductive materials of four types of IDTs with different thicknesses.

TABLE 3

| First Comb-Shaped Electrode | Second Comb-Shaped Electrode | Third Comb-Shaped Electrode | Fourth Comb-Shaped Electrode |
| --- | --- | --- | --- |
| Ni/Ti/Cu/Al/Substrate | Ti/Cu/Al/Substrate | Cu/Al/Substrate | Al/Substrate |
| Ni/Cu/Ti/Al/Substrate | Cu/Ti/Al/Substrate | Ti/Al/Substrate | Al/Substrate |
| Cu/Ti/Ni/Al/Substrate | Ti/Ni/Al/Substrate | Ni/Al/Substrate | Al/Substrate |
| Cu/Ni/Ti/Al/Substrate | Ni/Ti/Al/Substrate | Ti/Al/Substrate | Al/Substrate |
| Ti/Ni/Cu/Al/Substrate | Ni/Cu/Al/Substrate | Cu/Al/Substrate | Al/Substrate |
| Ti/Cu/Ni/Al/Substrate | Cu/Ni/Al/Substrate | Ni/Al/Substrate | Al/Substrate |
| Al/Ti/Cu/Pt/Substrate | Ti/Cu/Pt/Substrate | Cu/Pt/Substrate | Pt/Substrate |
| Al/Cu/Ti/Pt/Substrate | Cu/Ti/Pt/Substrate | Ti/Pt/Substrate | Pt/Substrate |

TABLE 3-continued

| First Comb-Shaped Electrode | Second Comb-Shaped Electrode | Third Comb-Shaped Electrode | Fourth Comb-Shaped Electrode |
|---|---|---|---|
| Ni/Ti/Cu/Pt/Substrate | Ti/Cu/Pt/Substrate | Cu/Pt/Substrate | Pt/Substrate |
| Ni/Cu/Ti/Pt/Substrate | Cu/Ti/Pt/Substrate | Ti/Pt/Substrate | Pt/Substrate |
| Cu/Ti/Al/Pt/Substrate | Ti/Al/Pt/Substrate | Al/Pt/Substrate | Pt/Substrate |
| Cu/Ti/Ni/Pt/Substrate | Ti/Ni/Pt/Substrate | Ni/Pt/Substrate | Pt/Substrate |
| Cu/Al/Ti/Pt/Substrate | Al/Ti/Pt/Substrate | Ti/Pt/Substrate | Pt/Substrate |
| Cu/Ni/Ti/Pt/Substrate | Ni/Ti/Pt/Substrate | Ti/Pt/Substrate | Pt/Substrate |
| Ti/Al/Cu/Pt/Substrate | Al/Cu/Pt/Substrate | Cu/Pt/Substrate | Pt/Substrate |
| Ti/Cu/Ni/Pt/Substrate | Cu/Ni/Pt/Substrate | Ni/Pt/Substrate | Pt/Substrate |
| Ti/Cu/Al/Pt/Substrate | Cu/Al/Pt/Substrate | Al/Pt/Substrate | Pt/Substrate |
| Ti/Ni/Cu/Pt/Substrate | Ni/Cu/Pt/Substrate | Cu/Pt/Substrate | Pt/Substrate |

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a first comb-shaped electrode disposed on a principal surface of the piezoelectric substrate; and
   a second comb-shaped electrode disposed on the principal surface of the piezoelectric substrate and having a thickness smaller than a thickness of the first comb-shaped electrode;
   wherein
   the first comb-shaped electrode includes a larger number of layers than the second comb-shaped electrode;
   an uppermost layer of the first comb-shaped electrode and an uppermost layer of the second comb-shaped electrode are made of different conductive materials;
   a surface of the uppermost layer of the second comb-shaped electrode is resistant to etching;
   the first comb-shaped electrode and the second comb-shaped electrode are tapered so that widths thereof decrease with increasing distance in a direction away from the piezoelectric substrate; and
   the layers of the first comb-shaped electrode include at least one etching stop layer defined by an oxidized layer.

2. The elastic wave device according to claim 1, wherein an insulating layer is located on the piezoelectric substrate and surfaces of the uppermost layers of the first and second comb-shaped electrodes.

3. The elastic wave device according to claim 1, wherein the elastic wave device is a filter, a duplexer, a triplexer, or a multiplexer.

4. The elastic wave device according to claim 1, wherein the elastic wave device includes a surface acoustic wave filter including two pass bands and separates a transmission signal and a reception signal.

5. The elastic wave device according to claim 1, wherein the elastic wave device is a boundary acoustic wave filter.

6. The elastic wave device according to claim 1, wherein the elastic wave device is an elastic plate wave filter.

* * * * *